United States Patent [19]
Usami et al.

[11] Patent Number: 5,126,597
[45] Date of Patent: Jun. 30, 1992

[54] HIGH SPEED IC DEVICE EMPOLYING NON-THRESHOLD LOGIC CIRCUITS TO PROVIDE LOGIC GATES HAVING DIFFERENT POWER AND LOAD REQUIREMENTS

[75] Inventors: Mitsuo Usami; Noboru Shiozawa; Kaoru Koyu, all of Ohme, Japan

[73] Assignee: Hitachi, Ltd., Tokyo, Japan

[21] Appl. No.: 548,835

[22] Filed: Jul. 6, 1990

[30] Foreign Application Priority Data

Jul. 13, 1989 [JP] Japan .................................. 1-180698

[51] Int. Cl.$^5$ ................. H03K 19/086; H03K 19/092; H03K 19/013
[52] U.S. Cl. ................................... 307/454; 307/455; 307/475
[58] Field of Search ............... 307/454, 455, 456, 443, 307/475, 270, 355, 356, 359, 467

[56] References Cited

U.S. PATENT DOCUMENTS

| | | | |
|---|---|---|---|
| 4,490,630 | 12/1984 | Freeman | 307/455 |
| 4,563,600 | 1/1986 | Koybayashi et al. | 307/455 |
| 4,609,837 | 9/1986 | Yagyuu et al. | 307/455 |
| 4,628,217 | 12/1986 | Berndt | 307/455 X |
| 4,686,395 | 8/1987 | Sato et al. | 307/455 |
| 4,725,744 | 2/1988 | Yagyuu et al. | 307/455 |
| 4,749,885 | 6/1988 | Gal | 307/454 |
| 4,806,785 | 2/1989 | Michail et al. | 307/454 X |
| 4,943,740 | 7/1990 | Gulczynski | 307/454 |

FOREIGN PATENT DOCUMENTS

| | | |
|---|---|---|
| 42-2294 | 2/1967 | Japan . |
| 42-21132 | 10/1967 | Japan . |
| 45-32005 | 10/1970 | Japan . |

Primary Examiner—Edward P. Westin
Assistant Examiner—David R. Bertelson
Attorney, Agent, or Firm—Antonelli, Terry, Stout & Kraus

[57] ABSTRACT

A unitary semiconductor integrated circuit is constructed using a non-threshold logic NTL circuit for a circuit which has a light load or a light load driving capability, using an NTL circuit additionally provided with an emitter-follower output circuit for effecting a circuit having a comparatively heavy load, and using a super pull-down logic (SPL) circuit for effecting a circuit having a heavy load. The NTL circuit thereof which receives an output signal generated by the emitter-follower output circuit or from the SPL circuit associated with a preceding logic gate circuit stage uses, as its operating voltage, the operating voltage of the emitter-follower output circuit or that of the SPL circuit.

22 Claims, 5 Drawing Sheets

HIGH SPEED IC DEVICE EMPOLYING NON-THRESHOLD LOGIC CIRCUITS TO PROVIDE LOGIC GATES HAVING DIFFERENT POWER AND LOAD REQUIREMENTS

CROSS-REFERENCE TO RELATED APPLICATIONS

A co-pending related U.S. application Ser. No. 07/330,461, filed on Mar. 30, 1989, to M. Usami et al., entitled "Semiconductor Integrated Circuit," and commonly assigned, showing an example of NTL (non-threshold logic) circuitry, and a packaged structure of a semiconductor chip to which the present invention can be applied, is incorporated herein by reference.

BACKGROUND OF THE INVENTION

1. Field of the Invention

This invention relates to semiconductor integrated circuit devices. More particularly, it relates to a technology which is effective when applied to, for example, semiconductor integrated circuit devices employing non-threshold logic circuits.

2. Description of the Related Art

High-speed bipolar type logic LSIs in the prior art are made using ECL (emitter coupling logic) technology. Unlike the ECL circuits which discriminate between high and low logic levels on the basis of a threshold voltage, NTL (non-threshold logic) circuits do not have any specified logic threshold. In NTL circuits, signals are amplified through a plurality of gate circuits. Herein, if the input/output transfer characteristics of the plurality of logical gate circuits intersect substantially at the center voltage, an input level higher than the point of intersection is amplified stepwise, thereby to finally converge to the side of the high level. In each logical gate circuit arrangement, a plurality of logical gates are connected in multistage fashion. Therefore, even when the transfer characteristics of the NTL circuit involve variations, i.e. become altered, the signal has its level corrected by passing through another logical gate circuit having similar variations. Accordingly, any such variations in the transfer characteristics does not develop into a serious problem in practice.

Such an NTL circuit is described in, for example, Genshiki Baba "Saishin Denshi Dabaisu Jiten", Rajio Gijutsu Sha, Mar. 20, 1976, p. 72. In addition, relevant patents are Japanese Patent Publication Nos. 42-21132/1967, 42-2294/1967 and 45-32005/1970.

Although ECL circuits operate at a high speed since the switching of the transistors thereof occurs while they are in an unsaturated state condition and the fact that small amplitudes are involved, they still have the problem of high power-consumption which directly leads to the requirement of high power for the large scale integrated circuits. In contrast, the NTL circuit is of low power-consumption and high operating speed and is accordingly suited to the large scale integration. However, the load driving capacity (capability) thereof is comparatively low.

SUMMARY OF THE INVENTION

Therefore, the inventors in consideration of such problems investigated a circuit (EF/NTL) wherein an emitter-follower output circuit is added for improving the load driving capacity, i.e. load driving and fan-out capability, of the NTL circuit or a so-called SPL (super pull-down logic) circuit wherein the emitter-follower output circuit is replaced with an active pull-down circuit, and they have developed a unitary circuit system wherein both types of circuits are implemented. Regarding the construction thereof, the inventors' studies have revealed the problem that the NTL circuit cannot be directly connected with a circuit wherein the emitter-follower output circuit is added to the NTL circuit or, for that matter, connected with an SPL circuit in some cases because the signal level requirements of both the circuits differ from each other.

An object of this invention is to provide a semiconductor integrated circuit device which exhibits both a low power-consumption and a high operating speed.

Another object of this invention is to provide a semiconductor integrated circuit device which realizes a large scale and a high operating speed.

The above and other objects and novel features of this invention will become apparent from the description of this specification and the accompanying drawings.

A brief description typifying the improved aspects of disclosed invention is summarized as follows: A unitary semiconductor integrated circuit is constructed therein an NTL circuit is implemented for a circuit having a light load (low driving capacity), an NTL circuit additionally provided with an emitter-follower output circuit is implemented for effecting a circuit having a comparatively heavy load, and an SPL circuit is implemented for effecting a circuit having a heavy load. The NTL circuit thereof which receives an output signal produced by the emitter-follower output circuit or from the SPL circuit of a preceding logic gate circuit stage uses commonly the operating voltage of the emitter-follower output circuit or that of the SPL circuit as its operating voltage, respectively.

By the means described above, the low power-consumption and high operating speed which are advantages characteristic of the NTL circuit are fully effected, and, at the same time, signal levels can be matched without adversely influencing the signal transmission speed by a simple construction where the voltage to be used for the NTL circuit is changed in accordance with the circuit arrangement of the preceding stage.

DESCRIPTION OF THE PREFERRED EMBODIMENTS

Figure 1:
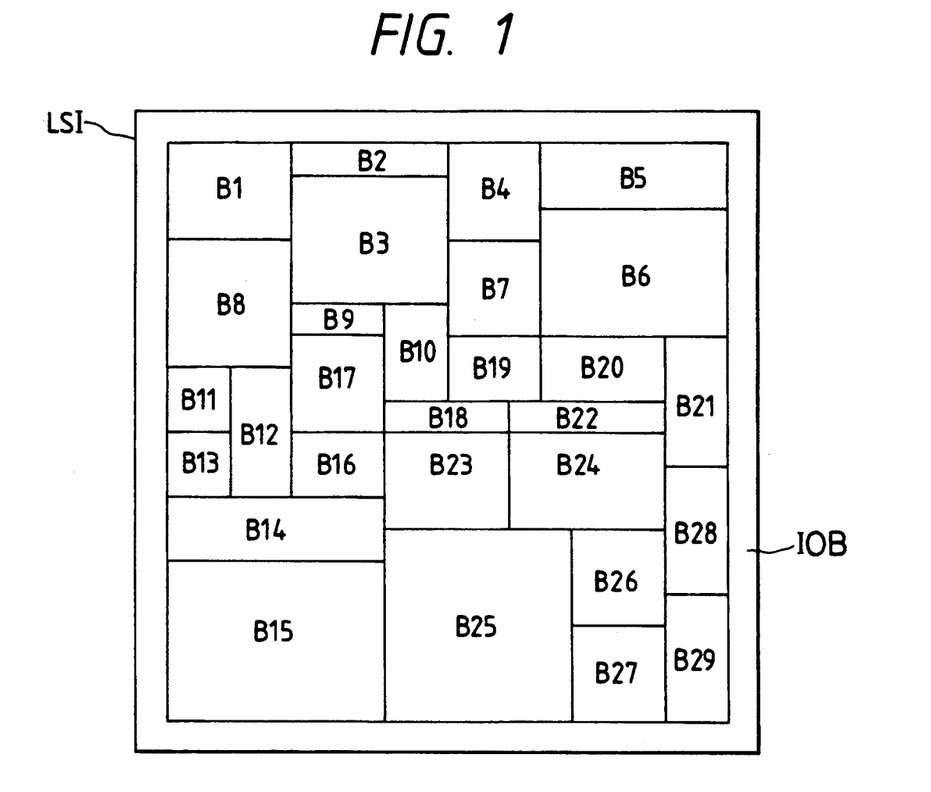
FIG. 1 is a schematic block diagram of an embodiment of a semiconductor integrated circuit device according to this invention.

Shown in FIG. 1 is a block diagram of an embodiment of a semiconductor integrated circuit device according to the present invention. The semiconductor integrated circuit device LSI in the figure is formed on one semiconductor substrate such as of single crystal silicon by a known process for manufacturing a bipolar type integrated circuit.

The semiconductor integrated circuit device LSI of this embodiment is constructed by combining functional blocks B1 thru B29 each of which is endowed with a specified function. That is, the functional blocks B1 thru B29 are circuit blocks respectively having the specified functions and the circuit blocks conforming to functions required by a user are selected from among previously registered ones such as standard cells or macrocells. The semiconductor integrated circuit device LS1 is provided with an input/output buffer IOB at the peripheral part of the chip thereof.

Figure 2:
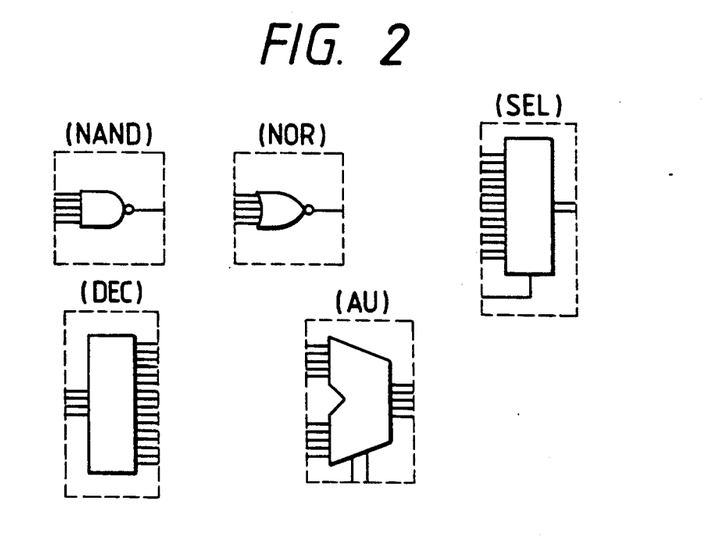
FIG. 2 is a logic circuit diagram showing examples of unit circuits which constitute each functional block.

FIG. 2 shows examples of unit logic circuits which constitute each of the functional blocks. NAND in the figure indicates a NAND gate circuit, NOR a NOR gate circuit, SEL a selector circuit which selects one or two signals from among a plurality of input signals, DEC a decoder circuit which receives signals of 4 bits and forms 16 output signals by way of example, and AU an arithmetical unit of, for example, 4 bits. Each of the selector circuit SEL, decoder circuit DEC and arithmetical unit AU comprises in combination unit gate circuits such as a NAND gate circuit and a NOR gate circuit. Each of the functional blocks B1 thru B29 comprises in combination the unit circuits as typically exemplified in FIG. 2. In the case where, in this manner, the unitary semiconductor integrated circuit device LSI is constructed by the combination of the circuit blocks B1 thru B29 having the specified functions prepared beforehand, the logical gate circuit of the smallest unit circuit has the magnitude of a load fixedly determined in accordance with the number of fan-outs, wiring length, etc., thereof.

With note taken of this fact, the gate circuit of the smallest unit circuit required for implementing the circuit blocks B1 thru B29 in the semiconductor integrated circuit device LSI of this embodiment is constructed in any of combinations as described below.

Figure 3:
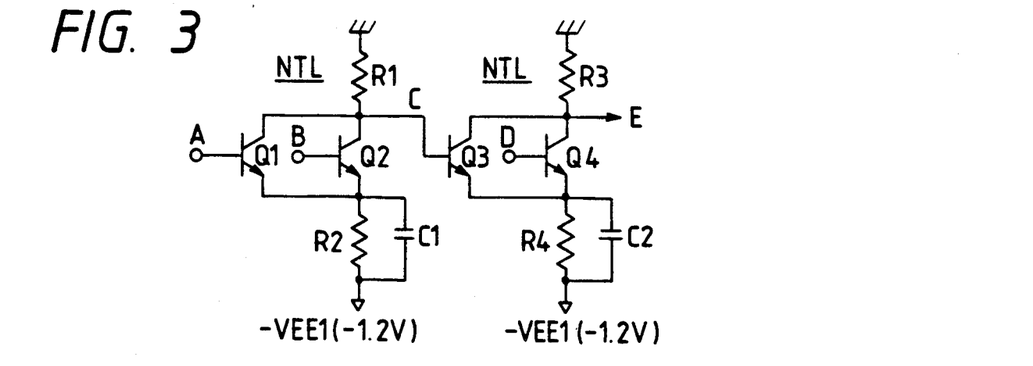
FIG. 3 is a circuit diagram showing an embodiment of a logical gate circuit in the case of a light load (small load or driving capability)

FIG. 3 shows a circuit diagram of an embodiment of a logical gate circuit in the case of a light load.

An NTL circuit is employed as a logical gate circuit having a light load requirement wherein the logical gate circuit receives input signals A and B and supplies an output signal C to only the input transistor Q3 of the succeeding stage of a logical gate circuit. More specifically, the NTL circuit on the preceding stage side is configured of transistors Q1 and Q2 which are connected in parallel, a resistor R1 connected at one end to ground potential and at another end thereof to the common collectors, i.e. commonly connected collectors, of the transistors Q1 and Q2, and a parallel connection of a resistor R2 and a capacitor C1 connected at one end to the common emitters, i.e. commonly connected emitters, of the transistors Q1 and Q2 and at the other end thereof to the supply potential $V_EE1$ ($-1.2V$). The bases of the transistors Q1 and Q2 are respectively supplied with the input signals A and B. This logical gate circuit of the smallest unit circuit operates as a NOR gate circuit for the reason that, when the input signal A or B is at a high level, the corresponding transistor Q1 or Q2 is turned "on" to generate the output signal C of a low level at the collectors which are connected in common.

Also the NTL circuit of the succeeding stage is constructed of a 2-input NOR gate circuit, similar to the above, wherein the input transistor Q3 has a base which receives the output signal C of the preceding-stage circuit, and the input transistor Q4 thereof has a base supplied with an output signal D from another similar preceding-stage NTL circuit, not shown. Thus, the NTL circuit of the succeeding stage delivers an output signal E from the commonly connected collectors of the transistors Q3 and Q4.

Figure 6:
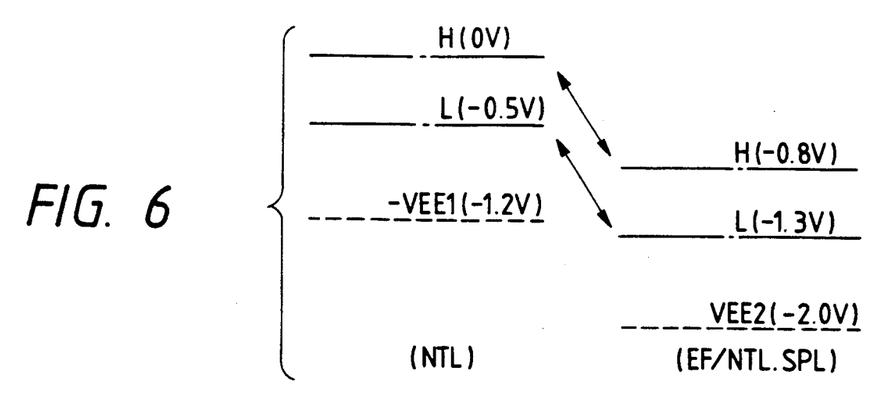
FIG. 6 is a conceptual diagram for explaining the signal levels and operating voltages of an NTL circuit, and EF/NTL circuit and an SPL circuit.

In such an NTL circuit, the operating voltage $-VEE1$ thereof is set at a low level, such as, of about $-1.2V$. As shown in FIG. 6, each of the output signals C and D has its high level H set at 0V such as the ground potential of the circuit and has its low level L set as $-0.5V$. The resistors R1 and R2 have their resistance ratio so set as to form the levels as mentioned above. In this manner, the NTL circuit is employed in the case of the logical gate circuit of a light load, whereby an ultrahigh-speed operation is performed at a low power-consumption because the operating voltage is low and the voltage signal amplitude levels of the NTL circuit are small.

Figure 4:
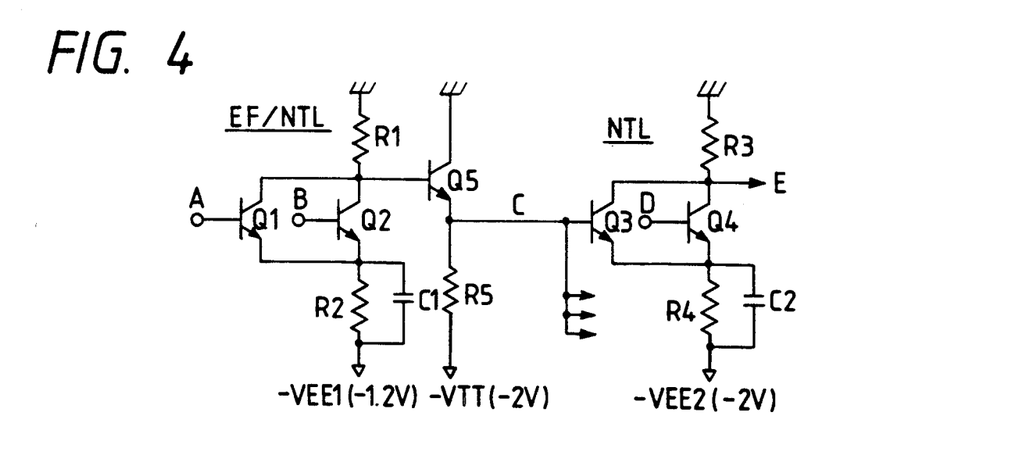
FIG. 4 is a circuit diagram showing an embodiment of a logical gate circuit in the case of a comparatively heavy load (large driving and fan-out capability)

FIG. 4 shows a circuit diagram of an embodiment of a logical gate circuit in the case of a comparatively heavy load i.e. the output driving and fan-out capability is large.

In a logical gate circuit having the comparatively heavy load, as in FIG. 4, such that the circuit receives input signals A and B and supplies an output signal C to the input transistor Q3 of a logical gate circuit of the succeeding stage thereof and also to the input transistors of a plurality of other logical gate circuits, not shown, an emitter-follower output circuit is added to the output portion of an NTL circuit preceding it. More specifically, the collector output signal of a transistor Q1 or Q2 is transmitted to the base of an emitter-follower output transistor Q5. The emitter of the transistor Q5 is provided with a load resistor R5. Such an NTL circuit which is additionally provided with the emitter-follower output transistor in this manner will be expressed henceforth as an "EF/NTL circuit" in the present application and in connection with the invention. In such a case where the emitter-follower output circuit is added to the output of an NTL circuit, the high and low levels of the NTL circuit, as stated above, are effectively shifted, by the emitter-base voltage drop $V_{BE}$ of the output transistor Q5, so as to provide an output signal C with a high level H set to be −0.8V and a low level L set to be −1.3V as illustrated in FIG. 6. Accordingly, when the operating voltage of the output circuit is left intact at −1.2V, the transistor Q5 cannot operate. Therefore, a high voltage, such as −2V, is employed as the operating voltage −VEE2. In this embodiment, the operating voltage −VEE1 for the preceding-stage circuit is used, which comprises transistors Q1, Q2, resistors R1, R2 and a capacitor C1. The reason the operating voltage −VEE1 is employed is that if a high voltage such as the voltage −VEE2 is instead set for the NTL level of the input signal A or B, when the signal A or B is of a low level of about −0.5V, the transistor Q1 or Q2 cannot be turned "off". Accordingly, in the case where the input signal A or B is generated by the EF/NTL circuit or an SPL circuit which will be described later, the operating voltage is correspondingly set at the voltage −VEE2.

When an NTL circuit similar to the foregoing receives the output signal C generated by the EF/NTL circuit, as described above, the input level thereof is shifted as explained above, and the voltage −VEE2 (−2V) is correspondingly fed and used as the operating voltage of the NTL circuit. That is, when employing such NTL circuits in succeeding stages, the operating voltages may be set at −VEE1 as shown in FIG. 3, or set at a different level such as −VEE2, as shown in FIG. 4, depending upon the circuit arrangements of the preceding stages. By virtue of the simple construction wherein the operating voltage supplied is in conformity with the preceding-stage circuit, such as, shown in FIG. 4, the signal can be transmitted at a high speed between different types of logical gate circuits without interposing a level shift circuit or the like for matching the levels. That is since the NTL circuit does not have specific logic threshold voltage requirements, as stated hereinabove, the input signals biased to the low level side as shown in FIG. 6 can be directly received merely by changing-over the operating voltage as described above to a voltage level allowing a binary logic switching operation to be effected in accordance with such low and high input signals.

When another NTL circuit corresponding to a light load receives the output signal E of the succeeding-stage circuit of FIG. 3, for example, the operating voltage thereof is not set at the voltage −VEE2 (−2V) as shown with respect to the example in FIG. 4, but is instead set at the voltage −VEE1 (−1.2V) as shown in FIG. 3.

Figure 5:
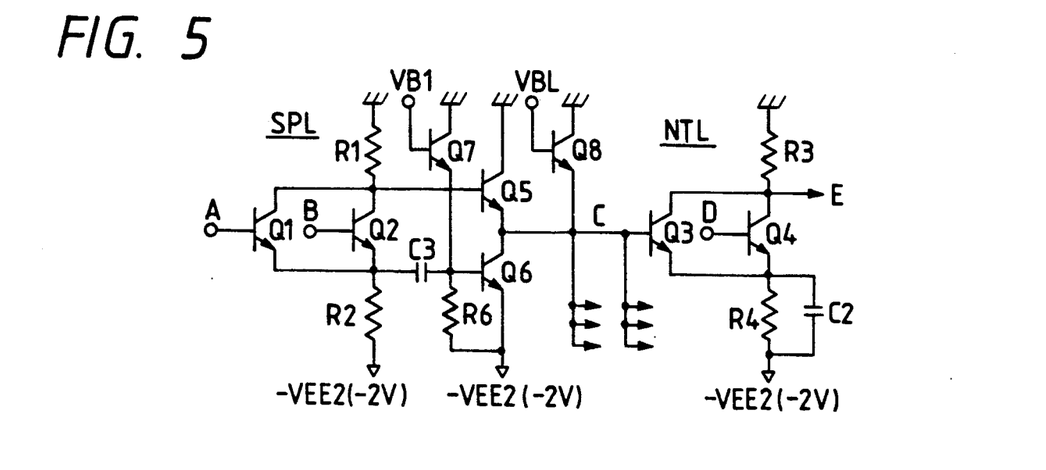
FIG. 5 is a circuit diagram showing an embodiment of a logical gate circuit in the case of a heavy load.

FIG. 5 shows a circuit diagram of an embodiment of a logical gate circuit in the case of an even heavier load requirement, i.e. a logic gate circuit having a large output driving and fan-out capability.

A so-called SPL circuit, wherein an emitter-follower output circuit therein is replaced with a super pull-down output circuit, is adopted for the logical gate circuit having a heavy load requirement wherein input signals A and B are received and an output signal C is supplied as an input signal to the input transistor Q3 of a logical gate circuit in a succeeding stage thereof and also to the input transistors of a large number of other logical gate circuits, not shown. Such an SPL circuit may be employed in connection with an output circuit which is included in the input/output circuit IOB in FIG. 1 which delivers output signals from the external terminals. More specifically, the collector output signal of a transistor Q1 or Q2 is transmitted to the base of an emitter-follower output transistor Q5. The emitter of the transistor Q5 is provided with an output transistor Q6 instead of the load resistor R5. The base of the transistor Q6 receives the emitter-side output signal of the transistor Q1 or Q2 transmitted thereto through a capacitor C3. In addition, a resistor R6 is connected between the base and emitter of the transistor Q6, and a bias current is supplied from a transistor Q7. The base of the transistor Q7 is supplied with a bias voltage VB1, and the base of the transistor Q6 is supplied with the base-emitter voltage $V_{BE}$. Since the output transistor Q6 and the emitter-follower output transistor Q5 are connected as a push-pull circuit arrangement, the output signal can be pulled down from its high level to its low level at high speed, and, accordingly, even a heavier load, i.e. a load of a greater fan-out capability, can be quickly driven. The NTL circuit which employs the super pull-down output circuit thus far described will henceforth be expressed as an "SPL (super pull-down logic) circuit" in the present application and in connectin with the disclosed invention. In the case of such an SPL circuit, the high and low levels of the NTL circuit, as stated hereinabove, are shifted by the emitter-base voltage $V_{BE}$ of the output transistor Q5. That is, the high level H becomes −0.8V and the low level L becomes −1.3V, as illustrated in FIG. 6. Accordingly, when the operating voltage of the push-pull type output circuit of the SPL circuit is left intact at −1.2V, the transistors Q5 and Q6 cannot operate. Therefore, a higher voltage such as −2V is employed thereat as the operating voltage −VEE2. A transistor Q8 disposed on the output side of the SPL circuit functions as a voltage level limiter transistor having a base fed with a limiter voltage VBL, thereby to prevent or relieve the occurrence of an undershoot of the output signal C. The transistor Q8 may be omitted when the undershoot is negligible. On the other hand, when the undershoot of the signal C cannot be disregarded, an undershoot or negative-going voltage limiter as that illustrated in FIG. 5 or another known type would be desirable. In fact, rather than employing the limiter on the output side thereof, one can also be implemented on the input side of a succeeding logic stage circuit to which the output of the SPL circuit, for example, is coupled to.

In the embodiment illustrated in FIG. 5, the operating voltage −VEE2 is used for the preceding-stage circuit which is configured of the transistors Q1, Q2, resistors R1, R2 and a capacitor C3. This corresponds to a case where the input signals A and B are output signals generated by, for example, the EF/NTL circuit or the SPL circuit. On the other hand, in the case where the input signal A or B is of an NTL level, a high operating voltage such as the voltage −VEE2 makes it impossible to turn off the transistor Q1 or Q2 when the signal A or B has a low level of about −0.5V. Therefore, in such a case, the operating voltage is set at −VEE1 as shown in FIG. 9.

When an NTL circuit, as described above, receives the output signal C of the SPL circuit as illustrated in FIG. 5, the input level of the signal is shifted as explained above, and hence, the voltage −VEE2 (−2V) is correspondingly applied as the operating voltage of the succeeding NTL circuit. That is, when implementing such NTL circuits in logic gate stage arrangements, some will have their operating voltages set at, −VEE1, as shown in FIG. 3, whereas others will have their operating voltages set at −VEE2, as shown in FIG. 4 or FIG. 5, for example, depending upon the circuit arrangements of the preceding stages. By virtue of the simple construction requirement that the operating voltage be supplied in conformity with the preceding-stage circuit as shown in FIG. 5, the signal can be transmitted at high speed between the logical gate circuits of different circuit forms without interposing a level shift circuit, or the like, for matching levels. That is, since the NTL circuit has no specific logic threshold voltage, as previously stated, the input signals biased to the low level side as shown in FIG. 6 can be directly received merely by changing-over the operating voltage as described hereinabove.

Figure 9:
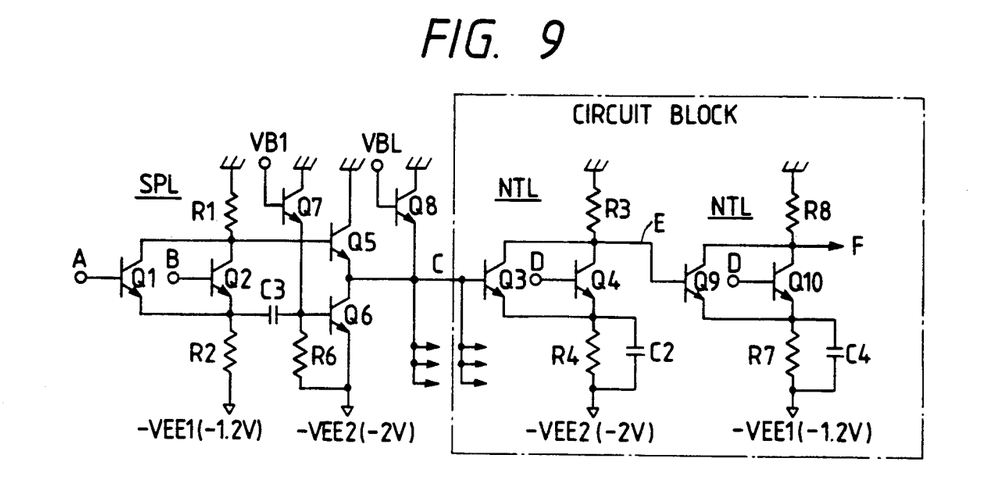
FIG. 9 is a circuit diagram showing another embodiment of the logical gate circuit in the case of heavy load.

When another NTL circuit acting as a light load of an immediately preceding logic gate circuit, such as a preceding stage NTL circuit, receives the output signal E of that preceding NTL circuit, the operating voltage thereof is not set at the voltage $-VEE2$ ($-2V$) as shown in FIG. 5, but rather is set at the voltage $-VEE1$ ($-1.2V$) as shown in FIG. 9 with respect to the second NTL circuit in the CIRCUIT BLOCK. In this case, an NTL circuit whose supply voltage is $-VEE2$ is employed as an input portion of the circuit block, and an NTL circuit whose supply voltage is $-VEE1$ is employed in the internal circuit of the circuit block, whereby the power consumption of the circuit block can be lowered.

Figure 10A:
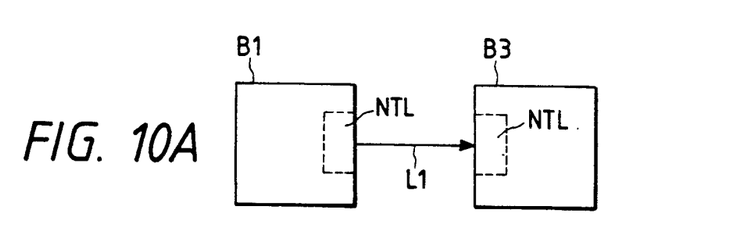
FIG. 10A, 10B and 10C are diagrams each showing another embodiment of the present invention.
Figure 10B:
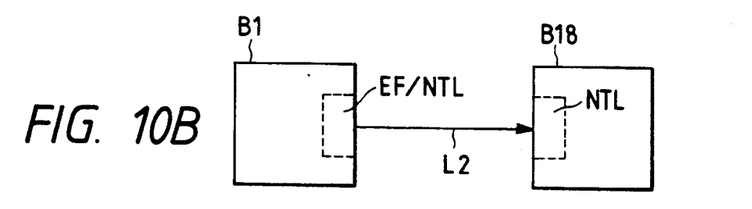
Figure 10C:
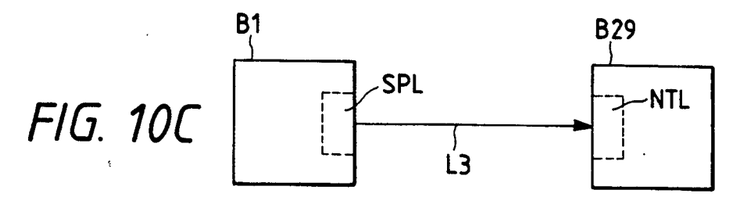

FIGS. 10A, 10B, and 10C show embodiments in the case where logic circuits are specifically used in accordance with the wiring lengths between circuit blocks connected with each other. FIG. 10A corresponds to a case where the circuit blocks B1 and B3 shown in FIG. 1 are coupled through a wiring line L1 whose length is comparatively short. The load capacity of a wiring line increases with the length thereof. Since the load capacity of the wiring line L1 is comparatively small, an output circuit which is provided in the circuit block B1 in order to drive the wiring line L1 is an NTL circuit. An input circuit which is provided in the circuit block B3 is also an NTL circuit. Accordingly, the coupling between the blocks as shown in FIG. 10A can be realized by the circuit arrangement as depicted in FIG. 3. Further, FIG. 10B corresponds to a case where the circuit blocks B1 and B18 shown in FIG. 1 are coupled through a wiring line L2 whose length is comparatively long. Since the load capacity of the wiring line L2 is comparatively large, an output circuit provided in the circuit block B1 in order to drive this wiring line is an EF/NTL circuit. An input circuit provided in the circuit block B18 is an NTL circuit. Accordingly, the coupling between the blocks as shown in FIG. 10B can be realized by the circuit arrangement as depicted in FIG. 4. Still further, FIG. 10C corresponds to a case where the circuit blocks B1 and B29 whereon in FIG. 1 are coupled through a wiring line L3 whose length is considerably long. Since the load capacity of the wiring line L3 is large, an output circuit provided in the circuit block B1 in order to drive this lengthy wiring line L3 is an SPL circuit. An input circuit provided in the circuit block B29 is an NTL circuit. Accordingly, the coupling between the blocks as shown in FIG. 10C can be realized by the circuit arrangement as depicted in FIG. 5 or FIG. 9.

FIG. 6 exemplifies the operating voltages and output signal levels of the NTL circuit, EF/NTL circuit and SPL circuit. In this manner, even between the logical gate circuits which have different level requirements, the output signal of the EF/NTL circuit or the SPL circuit can be directly received and the output signal of NTL level can be generated by changing-over the operating voltage $-VEE1$ of the NTL circuit side to the operating voltage $-VEE2$ of the EF/NTL circuit or the SPL circuit, as explained earlier. Therefore, the NTL circuit whose operating voltage is thus set at $-VEE2$ has both a logical function and a level converting function.

Figure 7:
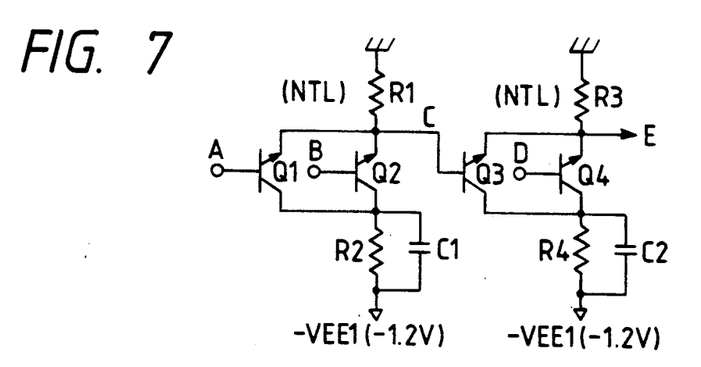
FIG. 7 is a circuit diagram showing another embodiment of the NTL circuit according to the present invention.

FIG. 7 shows a circuit diagram of another embodiment of the NTL circuit according to the present invention.

Figure 8:
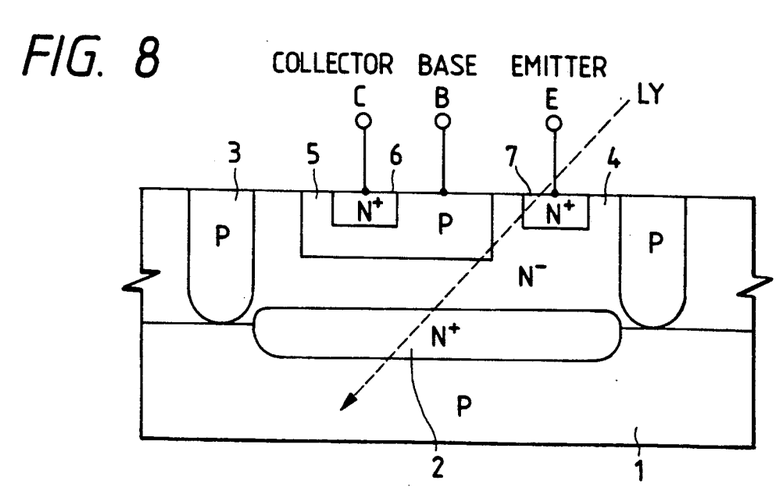
FIG. 8 is a schematic sectional view of an element structure showing the embodiment of the input transistor of the NTL circuit in FIG. 7.

In this embodiment, inverse transistors whose emitter and collector are reversed are adopted as input transistors Q1 thru Q4. More specifically, as shown in a schematic sectional view of an element structure in FIG. 8, the ordinary emitter region ($N^+$) 6 is used as the collector C, and the ordinary collector region 4 is used as the emitter E. A P-type region 5 is the base B. Numeral 1 designates a P-type semiconductor substrate. A buried collector layer 2 of $N^+$-type, is provided in a region of the semiconductor substrate 1. The epitaxial growth layer 4, of $N^-$-type, wherein an element forming region is provided is formed on the surface of the layer 2. The epitaxial growth layer 4, the buried collector layer 2 and an ohmic contact 7 constitute the emitter E. The epitaxial growth layer 4 is electrically isolated from another element by a P-type isolation region 3.

When the inverse transistors are adopted as in this embodiment, the probability at which alpha-rays LY produced in the package impinge the junction between the collector 6 and the base 5 is lowered thereby reducing the levels of noises in the output signals C and E of the NTL circuits shown in FIG. 7. More specifically when the input signals A and B of the preceding-stage NTL circuit are of a low level, the corresponding transistors Q1 and Q2 turn "off", and the output signal C becomes a high level. At this time, if the common collector portion of the transistors Q1 and Q2 is irradiated with alpha-particles, carriers are correspondingly generated which could result in the addition of an equivalent current absorbing circuit at the collector portion As a result, the output signal C would become lowered to the low level for a short time in spite of the "off" states of the transistors Q1 and Q2. When the inverse transistor structure is employed for the input transistors as in this embodiment, however, the probability of the irradiation with the alpha-rays LY can be rendered much lower than that in the case of employing the ordinary transistor structure.

The noise generated due to the alpha-ray irradiation is temporary, and the output signal C is returned to the high level by the supply of the current from a resistor R1. However in a case where a logical gate circuit which receives the signal C includes a latch circuit, this latch circuit may possibly operate erroneously, wherein its binary logic state condition is altered. Accordingly, the circuit which employs the inverse transistors as the input transistors, as described above, may be restricted to a circuit whose output signal is supplied to the latch circuit or to a circuit which receives the output signal in synchronism with a timing signal and then holds it.

Functional effects which are attained by the above embodiments are as listed below:

(1) A digital information processing circuit is constructed using an NTL circuit for a circuit which has a light load requirement, i.e. a low output driving and fan-out capability, using an EF/NTL circuit for a circuit of a comparatively heavier load requirement than that of an NTL circuit, and using an SPL circuit for a circuit of a heavy load requirement, i.e. a large output driving and fan-out capability; and the NTL circuit which receives an output signal generated by the EF/NTL circuit or the SPL circuit uses, as its operating voltage, the operating voltage of the output circuit of the EF/NTL circuit or the SPL circuit, respectively, thereby to produce an effect that a large-scale semiconductor integrated circuit device of low power-consumption and high operating speed can be formed.

(2) Logical gate circuits having different signal levels are directly connected to each other by changing-over the operating voltages as described above, thereby to produce the same interfacing effects that a level conversion circuit would provide without requiring it and that a large scale integration and a higher speed operation can be effected by utilizing the advantages of the NTL circuits can be realized.

(3) Inverse transistors, where the ordinary emitter region is used as a collector and the ordinary collector region is used as an emitter, are employed for constituting the NTL circuit, thereby to produce an effect whereby noises resulting from the irradiation of alpha-rays can be reduced.

Although, in the above, the invention made by the inventors has been specifically described with respect to the exemplified embodiments illustrated, it is obviously understood that this invention is not restricted to the foregoing embodiments, but that it can be exemplified with respect to other embodiments, including variations of those presently disclosed and which embodiments are characterized as being within the scope of the invention defined by the appended claims and without departing from the purport thereof. By way of example, the large-scale semiconductor integrated circuit device LSI may be made up of a gate array, other than the construction by the combination of macrocells or standard cells as described hereinabove In this case, as each logical gate, elements necessary for constructing the SPL circuit can be fabricated beforehand, and then the NTL circuit, the EF/NTL circuit or the SPL circuit can be formed in accordance with the load conditions of the logical gate. Besides, regarding the supply voltage lines, voltages —VEE1 and —VEE2 may be prepared and made available so that either of them can be used for the supply voltage lines in accordance with the input signal levels of the logical gate.

For example, in a case where, in FIG. 3, the input signal A is produced by an NTL circuit while the input signal B is produced by an EF/NTL circuit or an SPL circuit, an NTL circuit such as the succeeding-stage circuit in FIG. 4 may be inserted as a level conversion circuit, with which the level of the input signal B is converted into an NTL level so as to equalize the levels of the two input signals. Further, in a case where the input signal A is produced by an NTL circuit in FIG. 5, the NTL circuit may be additionally provided with an emitter-follower output transistor as a level conversion circuit.

Figure 11:
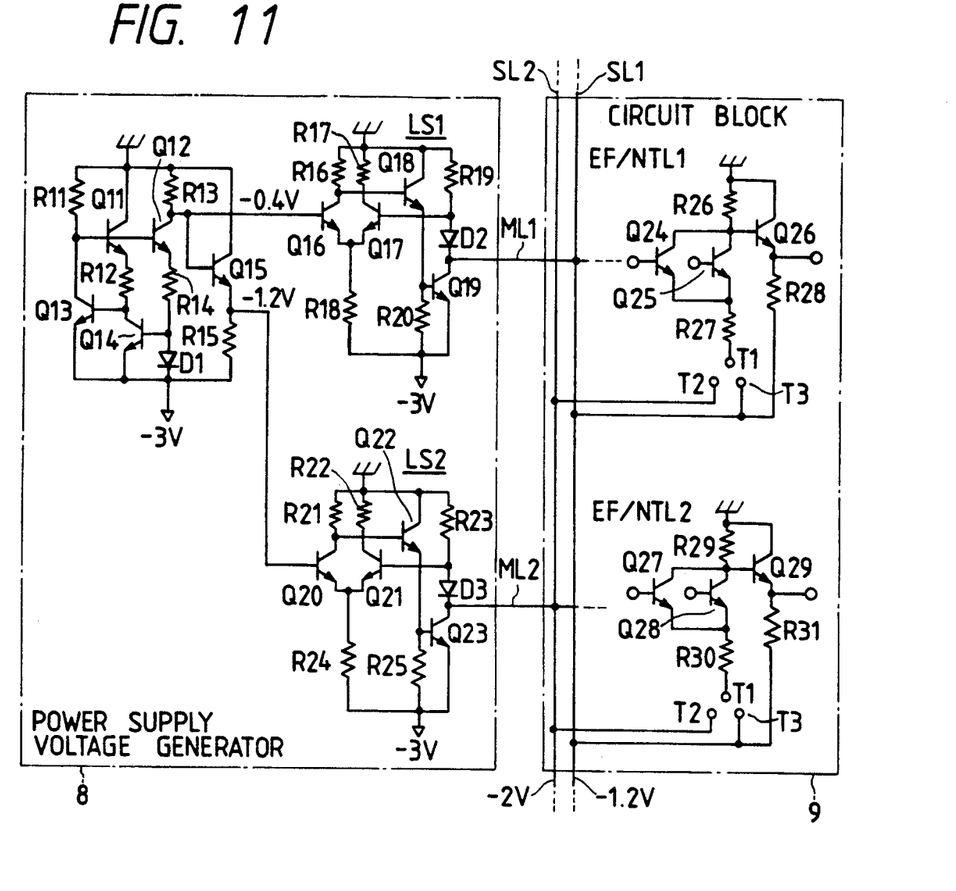
FIG. 11 is a circuit diagram showing an embodiment of a power supply voltage generator for providing internal supply voltages for the semiconductor integrated circuit device in FIG. 1, including an example of internal supply voltage wiring for feeding supply voltages to a circuit block.

FIG. 11 shows a practicable embodiment of a power supply voltage generator 8 which is built in the semiconductor integrated circuit illustrated in FIG. 1, and an example of supply voltage wiring for feeding supply voltages to a circuit block. The semiconductor integrated circuit formed on a single chip is externally fed with the ground potential and the supply voltage of —3V. The power supply voltage generator 8 produces the internal supply voltages (—1.2V and —2V) from the external supply voltages. It includes a preceding-stage circuit PC for producing voltages of —0.4V and —1.2V, and first and second level shift circuits LS1, LS2 for shifting the levels of the respective voltages. The preceding-state circuit PC is provided with transistors Q11 to Q14, resistors R11-R14 and a diode D1 all of which are used for producing the voltage of —0.4V from the supply voltage of —3V, and with a transistor Q15 and a resistor R15 both of which are used for constructing an emitter follower circuit for shifting the level of the voltage of —0.4V. The level shifting circuits LS1 and LS2 have the same arrangement. The level shifting circuit LS1, for example, includes a pair of transistors Q16 and Q17 having common emitters, a common emitter resistor R18, collector resistors R16 and R17, an emitter follower transistor Q18, an emitter resistor R20, a resistor R19 for feeding current to a level shift diode D2 and a transistor Q19. By virtue of this circuit arrangement, the first internal supply voltage (—1.2V) which is shifted by the forward voltage drop (0.8V) of the level shift diode D2 from the level of the input voltage of —0.4V is applied to the cathode of the diode D2. The first internal supply voltage (—1.2V) is fed to the first subsidiary wiring line SL1 through the first main wiring line ML1. To the cathode of a level shift diode D3 of the level shift circuit LS2, there is applied the second internal supply voltage (—2.0V) which is shifted by the forward voltage drop (0.8V) of the diode D3 from the level of the input voltage of —1.2V. The second internal supply voltage (—2.0V) is fed to the second subsidiary wiring line SL2 through the second main wiring line ML2.

First and second NTL circuits EF/NTL1 and EF/NTL2 having output emitter followers and having the same arrangement are exemplified within the circuit block 9. The supply voltage terminal T1 of each of these circuits is selectively connected to the terminal T3 thereof coupled with the subsidiary wiring line SL1 or the terminal T2 thereof coupled with the subsidiary wiring line SL2. For connecting the terminals with respect to an arrangement on a semiconductor chip, there is a method, for example, in which a through hole is formed between wiring lines of a multilayer structure through an insulator film, and thereafter both the wiring lines are connected by a conductor.

Figure 12:
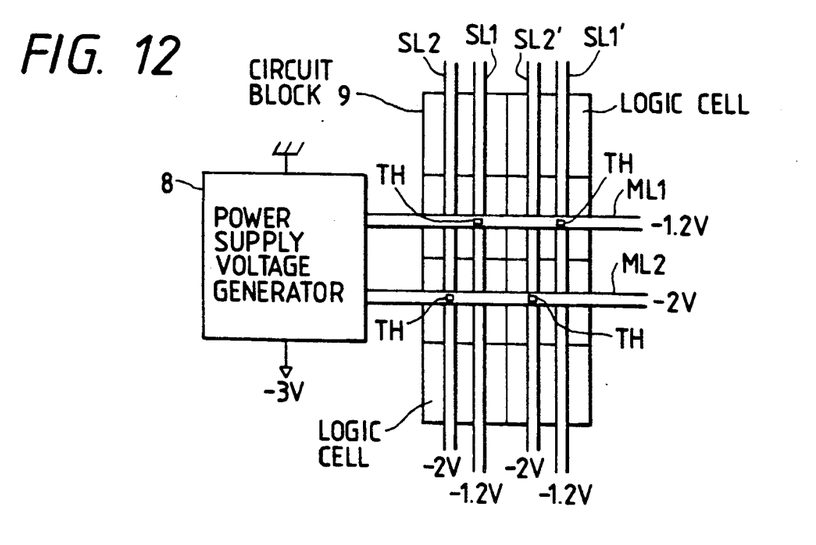
FIG. 12 shows the layout of supply voltage wiring for feeding internal supply voltages to circuit blocks within a semiconductor chip.

FIG. 12 shows the layout of supply voltage wiring for feeding internal supply voltages (—1.2V, —2V) to circuit blocks within a chip. A plurality of pairs of subsidiary supply voltage wiring lines (SL1, SL2), (SL1', SL2') are formed in correspondence with respective logic cell columns. The plurality of pairs of subsidiary supply voltage wiring lines are provided with one pair of main supply voltage wiring lines (ML1, ML2) in common. The subsidiary supply voltage wiring line and the main supply voltage wiring line are coupled through a conductor formed in a through hole TH. Although wiring lines for feeding the ground potential are omitted from the illustration of FIG. 12, they can be formed on the respective logic cell columns similarly to the layout of the subsidiary supply voltage wiring lines.

This present invention which is defined by the accompanying claims can be extensively utilized and fully made realizable for digital integrated circuit devices which are constructed especially using bipolar transistors.

What is claimed is: .

1. A semiconductor integrated circuit device comprising:
 a first non-threshold logic (NTL) circuit which is driven by a first negative supply voltage;

an emitter-follower output circuit, having an input coupled to an output of said first NTL circuit and being driven by a second negative supply voltage of greater magnitude than said first negative supply voltage, providing therethrough an output signal of said first NTL circuit to a first wiring line;

a second non-threshold logic (NTL) circuit, having an input coupled to said first wiring line for receiving as an input signal thereof a signal transmitted through said first wiring line, said second NTL circuit being driven by said second negative supply voltage;

third and fourth non-threshold logic (NTL) circuits which are driven by said first negative supply voltage, respectively;

a second wiring line which couples an output of said third NTL circuit with an input of said fourth NTL circuit;

a super pull-down logic (SPL) circuit which includes first and second bipolar transistor in series connection which are complementary operated by signals having mutually inverted phases and which are driven by said second negative supply voltage, said SPL circuit providing an output signal at an output thereof in accordance with said mutually inverted phase signals; and a third wiring line which couples the output of said SPL circuit with an input of a fifth non-threshold logic (NTL) circuit which is driven by said second negative supply voltage, wherein said first wiring line has a load capacity which is larger than that of said second wiring line, and wherein said third wiring line has a load capacity which is larger than that of said first wiring line.

2. A semiconductor integrated circuit device according to claim 1, further comprising:

a supply voltage producing circuit which includes means for producing said first and second negative supply voltages on the basis of a third negative supply voltage of greater magnitude than said second negative supply voltage, wherein said third negative supply voltage is provided from outside said semiconductor integrated circuit device.

3. A semiconductor integrated circuit device according to claim 1, further comprising:

a sixth non-threshold logic (NTL) circuit having an input terminal coupled so as to receive an output signal from an output of said fifth NTL circuit, and which is driven by said first negative supply voltage.

4. A semiconductor integrated circuit device according to claim 3, wherein said semiconductor integrated circuit device includes said plurality of circuit blocks, said emitter-follower output circuit corresponds to an output circuit of a first circuit block, and said second NTL circuit corresponds to an input circuit of a second circuit block.

5. A semiconductor integrated circuit device according to claim 4, wherein said SPL circuit corresponds to an output circuit of a third circuit block, said fifth NTL circuit corresponds to an input circuit of a fourth circuit block, and said sixth NTL circuit corresponds to an internal circuit of a fourth circuit block.

6. A semiconductor integrated circuit device comprising:

a first non-threshold logic (NTL) circuit which is driven by a first negative supply voltage;

an emitter-follower output circuit, having an input coupled to an output of said first NTL circuit and being driven by a second negative supply voltage of greater magnitude than said first negative supply voltage, providing therethrough an output signal of said first NTL circuit to a first wiring line;

a second non-threshold logic (NTL) circuit, having an input coupled to said first wiring line for receiving as an input signal thereof a signal transmitted through said first wiring line, said second NTL circuit being driven by said second negative supply voltage;

third and fourth non-threshold logic (NTL) circuits which are driven by said first negative supply voltage, respectively;

a second wiring line which couples an output of said third NTL circuit with an input of said fourth NTL circuit;

a super pull-down logic (SPL) circuit which includes first and second bipolar transistors in series connection which are complementary operated by signals having mutually-inverted phases and which are driven by said second negative supply voltage, said SPL circuit providing an output signal at an output thereof in accordance with said mutually inverted phase signals; and a third wiring line which connects the output of said SPL circuit with an input of a fifth non-threshold logic (NTL) circuit which is driven by said second negative supply voltage, wherein said first wiring line has a wiring length which is greater than that of said second wiring line, and wherein said third wiring line has a wiring length which is greater than that of said first wiring line.

7. A semiconductor integrated circuit device according to claim 6, further comprising:

a supply voltage producing circuit which includes means for producing said first and second negative supply voltages on the basis of a third negative supply voltage of a magnitude greater than said second negative supply voltage;

wherein said third negative supply voltage is provided from outside said semiconductor integrated circuit device.

8. A semiconductor integrated circuit device according to claim 6, comprising:

sixth non-threshold logic (NTL) circuit having an input terminal coupled to receive an output signal of said fifth NTL circuit, and which is driven by said first negative supply voltage.

9. A semiconductor integrated circuit device according to claim 8, wherein said semiconductor integrated circuit device includes a plurality of circuit blocks, said emitter-follower output circuit corresponds to an output circuit of a first circuit block, and said second NTL circuit corresponds to input circuit of a second circuit block.

10. A semiconductor integrated circuit device according to claim 9, therein said SPL circuit corresponds to an output circuit of a third circuit block, said fifth NTL circuit corresponds to an input circuit of a fourth circuit block, and said sixth NTL circuit corresponds to an internal circuit of said fourth circuit block.

11. A semiconductor integrated circuit device according to claim 5, wherein said third and fourth NTL circuits are included as input and output circuits in fifth and sixth circuit blocks, respectively.

12. A semiconductor integrated circuit according to claim 11, further comprising:
   a supply voltage producing circuit which includes means for producing said first and second negative supply voltages on the basis of a third negative supply voltage of greater magnitude than said second negative supply voltage,
   wherein said third negative supply voltage is provided from outside said semiconductor integrated circuit device.

13. A semiconductor integrated circuit device according to claim 10, further comprising:
   a supply voltage producing circuit which includes means for producing said first and second negative supply voltages on the basis of a third negative supply voltage of greater magnitude than said second negative supply voltage,
   wherein said third negative supply voltage is provided from outside said semiconductor integrated circuit device.

14. A semiconductor integrated circuit device according to claim 1, wherein said semiconductor integrated circuit device is a single chip integrated circuit (IC) device which includes a plurality of circuit blocks, said emitter-follower output circuit corresponds to an output circuit of a first circuit block which also includes said first NTL circuit, said second NTL corresponds to an input circuit of a second circuit block, said third NTL circuit corresponds to an output circuit of a third circuit block, said fourth NTL circuit corresponds to an input circuit of a fourth circuit block, said SPL circuit corresponds to an output circuit of a fifth circuit block, said fifth NTL circuit corresponds to an input circuit of a sixth circuit block, and said sixth NTL circuit corresponds to an internal circuit of said sixth circuit block.

15. A semiconductor integrated circuit device according to claim 14, further comprising:
   a supply voltage producing circuit which includes means for producing said first and second negative supply voltages on the basis of a third negative supply voltage of greater magnitude than said second negative supply voltage,
   wherein said third negative supply voltage is provided from outside said semiconductor integrated circuit device.

16. A semiconductor integrated circuit device comprising:
   a first non-threshold logic circuit which is driven by a first supply voltage;
   an emitter-follower output circuit, having an input coupled to an output of said first non-threshold logic circuit and being driven by a second supply voltage, providing therethrough an output signal of said first non-threshold logic circuit to a first line;
   a second non-threshold logic circuit, having an input coupled to said first line for receiving as an input signal thereof a signal transmitted through said first line, said second non-threshold logic circuit being driven by said second supply voltage;
   third and fourth non-threshold logic circuits which are driven by said first supply voltage;
   a second line which couples an output of said third non-threshold logic circuit with an input of said fourth non-threshold logic circuit;
   a fifth non-threshold logic circuit which is driven by said second supply voltage;
   a push-pull output circuit, having first and second bipolar transistors in series connection which are complementarily operated by output signals of said fifth non-threshold logic circuit, providing therethrough an output signal of said fifth non-threshold logic circuit to a third line; and
   a sixth non-threshold logic circuit, having an input coupled to said third line for receiving as an input signal thereof a signal transmitted through said third line.

17. A semiconductor integrated circuit device according to claim 16, wherein said push-pull output circuit includes a capacitor coupled to the base of said second bipolar transistor so that the output signal thereof is pulled down from a high level to a logic low level at high speed.

18. A semiconductor integrated circuit device according to claim 17, wherein said first line has a load capacity which is larger than that of said second line, and wherein said third line has a load capacity which is larger than that of said first line.

19. A semiconductor integrated circuit device according to claim 17, wherein said first line has a length which is greater than that of said second line, and wherein said third line has a length which is greater than that of said first line.

20. A semiconductor integrated circuit device according to claim 16, wherein said first supply voltage has a smaller absolute value than an absolute value of said second supply voltage.

21. A semiconductor integrated circuit device according to claim 18, wherein said first supply voltage has a smaller absolute value than an absolute value of said second supply voltage.

22. A semiconductor integrated circuit device according to claim 19, wherein said first supply voltage has a smaller absolute value than an absolute value of said second supply voltage.

* * * * *